(12) United States Patent
Wang et al.

(10) Patent No.: US 12,382,819 B2
(45) Date of Patent: Aug. 5, 2025

(54) ORGANIC LIGHT EMITTING DIODE DISPLAY DEVICE

(71) Applicant: Samsung Display Co., Ltd., Yongin-si (KR)

(72) Inventors: Seong Min Wang, Yongin-si (KR); Jung Gun Nam, Suwon-si (KR); Byeong Hoon Cho, Seoul (KR); Mu Gyeom Kim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/301,345

(22) Filed: Apr. 17, 2023

(65) Prior Publication Data

US 2023/0255052 A1   Aug. 10, 2023

Related U.S. Application Data

(60) Continuation of application No. 17/137,842, filed on Dec. 30, 2020, now Pat. No. 11,653,527, which is a division of application No. 15/807,112, filed on Nov. 8, 2017, now Pat. No. 10,903,456, which is a division of application No. 14/805,533, filed on Jul. 22, 2015, now Pat. No. 9,825,259.

(30) Foreign Application Priority Data

Jan. 15, 2015   (KR) ........................ 10-2015-0007457

(51) Int. Cl.
*H10K 59/80*   (2023.01)
*H10K 50/86*   (2023.01)
*H10K 59/12*   (2023.01)
*H10K 77/10*   (2023.01)

(52) U.S. Cl.
CPC ....... *H10K 59/8792* (2023.02); *H10K 50/865* (2023.02); *H10K 59/12* (2023.02); *H10K 77/111* (2023.02)

(58) Field of Classification Search
CPC .................................................. H01L 27/3272
See application file for complete search history.

(56) References Cited

U.S. PATENT DOCUMENTS 7,944,140 B2    5/2011   Kwak et al.
8,551,804 B2 *  10/2013  Hori ..................... H10K 50/858
                                                        438/69
8,690,414 B2    4/2014   Tomotoshi et al.
(Continued)

FOREIGN PATENT DOCUMENTS

KR   10-2008-0033729   4/2008
KR   10-0839750        6/2008
(Continued)

*Primary Examiner* — Yu-Hsi D Sun
(74) *Attorney, Agent, or Firm* — KILE PARK REED & HOUTTEMAN PLLC

(57) ABSTRACT

An organic light emitting diode display device, including a flexible substrate; pixels on the flexible substrate, the pixels including an organic emission layer; a pixel definition layer between the pixels, the pixel definition layer including openings; an encapsulation layer covering the pixels; and a conductive light shielding member on the encapsulation layer, the conductive light shielding member not overlapped with the pixels, and overlapped with the pixel definition layer.

10 Claims, 4 Drawing Sheets

(56) References Cited

U.S. PATENT DOCUMENTS

2009/0045724 A1    2/2009   Tagawa et al.
2017/0077149 A1    3/2017   Uemura et al.

FOREIGN PATENT DOCUMENTS

| KR | 10-2008-0107298 | 12/2008 |
| KR | 10-0963074 | 6/2010 |
| KR | 10-2013-0026839 | 3/2013 |
| KR | 10-2014-0064185 | 5/2014 |

* cited by examiner

ORGANIC LIGHT EMITTING DIODE DISPLAY DEVICE

CROSS-REFERENCE TO RELATED APPLICATIONS

This is a continuation application of U.S. patent application Ser. No. 17/137,842, filed Dec. 30, 2020, now U.S. Pat. No. 11,653,527 issued May 16, 2023, the entire contents of which are incorporated herein by reference. U.S. patent application Ser. No. 17/137,842 is a divisional application of U.S. patent application Ser. No. 15/807,112 filed Nov. 8, 2017, now U.S. Pat. No. 10,903,456, issued Jan. 26, 2021, the entire contents of which are incorporated herein by reference. U.S. patent application Ser. No. 15/807,112 is a divisional application of U.S. patent application Ser. No. 14/805,533 filed Jul. 22, 2015, now U.S. Pat. No. 9,825,259, issued Nov. 21, 2017, the entire contents of which are incorporated herein by reference. U.S. Pat. No. 9,825,259 claims priority to and benefits of Korean Patent Application No. 10-2015-0007457 filed on Jan. 15, 2015 in the Korean Intellectual Property Office, the entire contents of which are incorporated herein by reference for all purposes.

BACKGROUND

1. Field

Embodiments relate to an organic light emitting diode display device.

2. Description of the Related Art

A flat panel display (FPD) such as, for example, a liquid crystal display (LCD), an organic light emitting diode display (OLED), or an electrophoretic display (EPD), may include a display panel including an electric field generating electrode and an electro-optical active layer. As the electro-optical active layer, each of panels of the organic light emitting diode display, the liquid crystal display, and the electrophoretic display may include an organic emission layer, a liquid crystal layer, and particles charged with electric charges. The electric field generating electrode may be connected to a switching device such as, for example, a thin film transistor, to receive a data signal, and the electro-optical active layer may convert the data signal into an optical signal to display an image.

SUMMARY

Embodiments may be realized by providing an organic light emitting diode display device, including a flexible substrate; pixels on the flexible substrate, the pixels including an organic emission layer; a pixel definition layer between the pixels, the pixel definition layer including openings; an encapsulation layer covering the pixels; and a conductive light shielding member on the encapsulation layer, the conductive light shielding member not overlapped with the pixels, and overlapped with the pixel definition layer.

The pixels may be in a matrix form.

The conductive light shielding member may include a carbon black and a polymer organic material.

A content of carbon black in the conductive light shielding member may be 30 weight % or less.

The conductive light shielding member may be formed by an inkjet printing method.

The conductive light shielding member may be electrically connected to a ground electrode of a pad part outside the encapsulation layer.

Embodiments may be realized by providing an organic light emitting diode display device, including a flexible substrate; a semiconductor layer on the flexible substrate; a gate insulating layer on the semiconductor layer; a gate electrode on the gate insulating layer; an interlayer insulating layer on the gate electrode; a source electrode and a drain electrode on the interlayer insulating layer; a pixel electrode electrically connected to the drain electrode; organic emission layers on the pixel electrode and pixel definition layers between the organic emission layers, the pixel definition layers not overlapped with the organic emission layers; a common electrode on the organic emission layers and the pixel definition layers; and an encapsulation layer covering the common electrode, the gate electrode, the source electrode, and the drain electrode each being a shielding electrode having low reflection characteristics.

Each shielding electrode may include a copper (Cu) layer, an indium zinc oxide (IZO) layer, and a titanium (Ti) layer that are sequentially formed.

Each shielding electrode may include a mixture of two or more of copper (Cu), copper nitride ($CuN_x$), titanium (Ti), titanium nitride ($TiN_x$), titanium oxide ($TiO_x$), molybdenum nitride ($MoN_x$), indium zinc oxide (IZO), and indium tin oxide (ITO).

Each shielding electrode may be electrically connected to a ground electrode of a pad part outside the encapsulation layer.

Embodiments may be realized by providing an organic light emitting diode display device, including an upper substrate; and a lower substrate facing the upper substrate, the lower substrate having pixels thereon, the pixels including an organic emission layer, a low reflection opaque metal layer being formed in a non-pixel area that is not overlapped with the pixels at an inner side of the upper substrate.

The low reflection opaque metal layer may include a copper (Cu) layer, an indium zinc oxide (IZO) layer, and a titanium (Ti) layer that are sequentially formed.

The low reflection opaque metal layer may include a mixture of two or more of copper (Cu), copper nitride ($CuN_x$), titanium (Ti), titanium nitride ($TiN_x$), titanium oxide ($TiO_x$), molybdenum nitride ($MoN_x$), indium zinc oxide (IZO), and indium tin oxide (ITO).

The organic light emitting diode display device may include an encapsulation layer covering the pixels. The low reflection opaque metal layer may be electrically connected to a ground electrode of a pad part outside the encapsulation layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
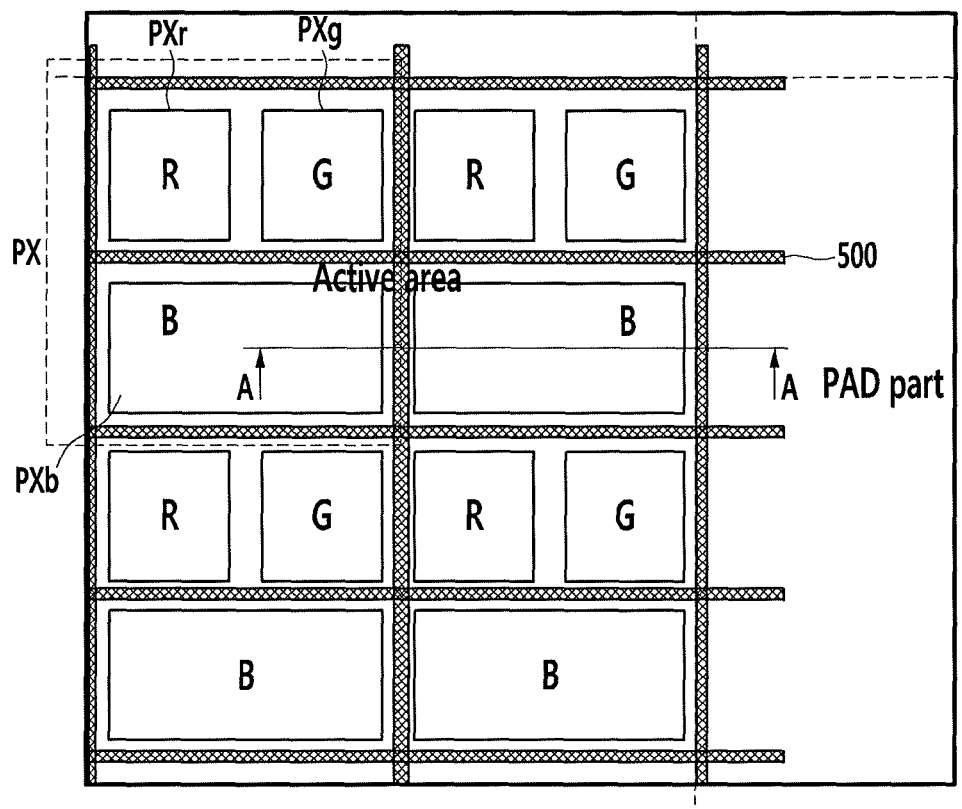
FIG. 1 illustrates a layout diagram of pixels of an organic light emitting diode display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the following detailed description, only certain exemplary embodiments have been shown and described, simply by way of illustration. As those skilled in the art would realize, the described embodiments may be modified in various different ways.

Throughout the specification, unless explicitly described to the contrary, the word "comprise" and variations such as "comprises" or "comprising", will be understood to imply the inclusion of stated elements but not the exclusion of any other elements.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. To the contrary, it will be understood that when any element is referred to as being "directly on" another element, an element may be not present therebetween.

Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

An exemplary embodiment will hereinafter be described in detail with reference to the accompanying drawings.

Figure 2:
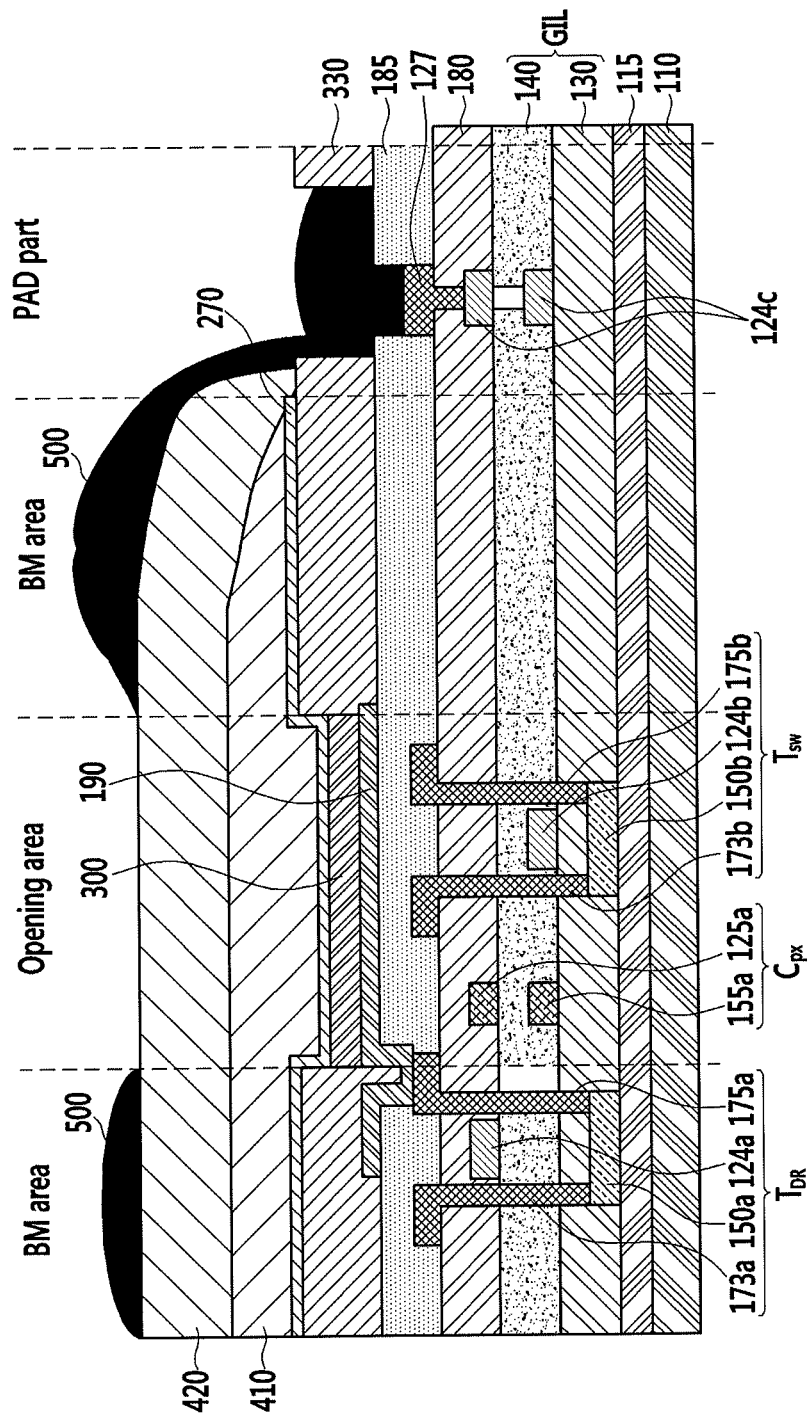
FIG. 2, which illustrates a cross-sectional view taken along line A-A of FIG. 1, illustrates a diagram of a first exemplary embodiment.

FIG. 1 illustrates a layout diagram of pixels of an organic light emitting diode display device according to an exemplary embodiment, and FIG. 2, which illustrates a cross-sectional view taken along line A-A of FIG. 1, illustrates a diagram of a first exemplary embodiment.

As shown in FIG. 1, an organic light emitting diode display device according to an exemplary embodiment may include a red pixel PXr, a green pixel PXg, and a blue pixel PXb in a unit pixel PX.

The red pixel PXr and the green pixel PXg may be positioned adjacent to each other in a horizontal direction, and the blue pixel PXb may be positioned below the red pixel PRx and the green pixel PXg. The red pixel PXr and the green pixel PXg may have a narrow width unlike the blue pixel PXb, and the blue pixel Pb may have a wide width corresponding widths of the red pixel PXr and the green pixel PXg and an interval between two pixels. Pixel arrangements in unit pixels PXs shown in FIG. 1 may be various according to an exemplary embodiment.

The unit pixels PXs having the structure as described above may be arranged in a matrix form depending on a row and a column.

A light shielding member 500 may be formed between neighboring unit pixels PXs. The light shielding member 500 may be formed of a lattice stripe pattern corresponding to a pixel definition layer 330 at a boundary part between the pixels PXs and may serve as a black matrix to help prevent leakage of light between the pixels PXs to help increase sharpness of the pixels PXs.

The light shielding member 500 may contain a carbon black, which may be an inorganic black material, and a polymer organic material corresponding to one or a mixture of two of polyacrylate, polystyrene, and polyethylene. A content of the carbon black may be 30 weight % or less, a content of the polymer organic material may be 80 weight % or less, and the light shielding member 500 may be formed by an inkjet printing method.

First, structures of the pixels (red pixel (PXr), green pixel (PXg), and blue pixel (PXb)) as shown in FIG. 2 will be described.

One pixel may include an organic emission layer 300, a pixel electrode 190 may be positioned beneath the organic emission layer 300, and a common electrode 270 may be positioned on the organic emission layer 300. The pixel electrode 190 may be an electrode separated per pixel, and the common electrode 270 may be an electrode formed integrally in all of the pixels.

The pixel electrode 190 may be connected to an output terminal (drain electrode 175a) of a thin film transistor such as a driving transistor TDR to receive an output current of the driving transistor TDR. The thin film transistor such as the driving transistor TDR may include a polycrystalline semiconductor layer 150a, a gate electrode 124a, a source electrode 173a, and the drain electrode 175a.

One pixel may include a pixel capacitor CPX connected to the source electrode 173a and the gate electrode 124a of the driving transistor TDR. The pixel capacitor CPX may include a lower capacitor electrode 155a formed of a doped polycrystalline semiconductor, an upper capacitor electrode 125a formed of the same material as that of the gate electrode 124a on the same layer as that of the gate electrode 124a, and a gate insulating layer (GIL), which may be an insulating layer positioned between the lower gate electrode 155a and the upper capacitor electrode 125a. According to an exemplary embodiment, the pixel capacitor CPX may include an upper capacitor electrode 125a and a capacitor electrode overlapped with the upper capacitor electrode 125a with an interlayer insulating layer 180 interposed therebetween or may further include the capacitor electrode, and any one capacitor electrode may also be formed on a layer different from an illustrated layer.

Layer structures of a pixel area including the components as described above will be sequentially described below.

A lower substrate 110 may be a flexible substrate such as a polymer film. In an embodiment, the lower substrate 110 may be formed of thermoplastic semicrystalline polymer such as, for example, polyethylene terephthalate (PET), polyethylene naphthalate (PEN), or polyethylene ether ketone (PEEK), thermoplastic amorphous polymer such as, for example, polycarbonate (PC) or polyethylene sulfonate (PES), or plastic such as, for example, polyimide (PI) or polyarylate (PAR), having relatively high heat resistance.

A buffer layer 115 may be formed on the lower substrate 110 to help prevent invasion of, for example, moisture or oxygen. The buffer layer 115 may contain, for example, silicon nitride ($SiN_x$), silicon oxide ($SiO_x$), or silicon oxynitride ($SiO_xN_y$), and may be formed as a single layer or a multilayer. An overcoat layer may also be formed on the buffer layer 115 to help protect the buffer layer 115.

The driving transistor TDR and a switching transistor TSW may be disposed on the buffer layer 115, and may be spaced apart from each other. The polycrystalline semiconductor layer 150a of the driving transistor TDR and the lower capacitor electrode 155a, which may be the doped polycrystalline semiconductor, may be formed on the buffer layer 115.

The polycrystalline semiconductor layer 150a may include the source electrode 173a and the drain electrode 175a disposed at both edges thereof, wherein the source electrode 173a and the drain electrode 175a may be doped with impurities. The doped polycrystalline semiconductor forming the lower capacitor electrode 155a may have characteristics of a conductor rather than characteristics of a semiconductor due high concentration doping. The buffer layer 115 may help block impurities from being introduced from the lower substrate into the semiconductor at the time of performing a crystallization process to form a polycrystalline semiconductor.

The switching transistor TSW may have the same structure as that of the driving transistor TDR. A polycrystalline semiconductor layer 150b may be formed on the buffer layer 115 formed on the lower substrate 110. A source electrode 173b and a drain electrode 175b may be formed at both edges of the polycrystalline semiconductor layer 150b.

The polycrystalline layers 150a and 150b and the exposed buffer layer 115 may be covered by a first gate insulating layer 130. The gate insulating layer GIL may be formed in a multilayer structure including the first gate insulating layer 130 and a second gate insulating layer 140 formed of an inorganic material or an organic material.

The lower capacitor electrode 155a and a gate electrode 124b of the switching transistor TSW may be formed on the first gate insulating layer 130. The upper capacitor electrode 125a and the gate electrode 124a of the driving transistor TDR may be formed on the second gate insulating layer 140. The gate electrode 124a may be overlapped with a portion of the polycrystalline semiconductor layer 150a, and the upper capacitor electrode 125a may be overlapped with the lower capacitor electrode 155a.

An interlayer insulating layer 180 may be formed on the gate electrode 124a of the driving transistor TDR, the upper capacitor electrode 125a, and the exposed second gate insulating layer 140. The interlayer insulating layer 10 may be formed of an organic material or an inorganic material.

The interlayer insulating layer 180 and the gate insulating layer GIL may expose a source region and a drain region of the polycrystalline semiconductor layer 150a through contact holes. The source electrode 173a and the drain electrode 175a may be formed on the interlayer insulating layer 180 and in the contact hole. The source electrode 173a may contact the source region of the polycrystalline semiconductor layer 150a, and the drain electrode 175a may contact the drain region of the polycrystalline semiconductor layer 150a.

A passivation layer 185 may be formed on the source electrode 173a, the drain electrode 175a, and the interlayer insulating layer 180. The passivation layer 185 may be formed of an organic material or an inorganic material. The passivation layer 185 may have a contact hole formed therein to expose the drain electrode 175a. The pixel electrode 190 may be formed on the passivation layer 185 and in the contact hole. The pixel electrode 190 may be connected to the drain electrode 175a through the contact hole.

A pixel definition layer (PDL) 330 may be formed in the vicinity of the pixel electrode 190, and may include a plurality of openings corresponding to a pixel. The pixel definition layer 330 may be formed of a resin such as, for example, a polyacrylate or a polyimide. The pixel electrode 190 may be exposed in portions in which the pixel definition layer 330 is not formed, and the organic emission layer 300 may be positioned on the pixel electrode 190. The organic emission layer 300 may include an emission layer (EML), may be formed of a plurality of layers including one or more of a hole injection layer (HIL), a hole transport layer (HTL), an electron transport layer (ETL), and an electron injection layer (EIL), and may emit different colors depending on a kind of organic materials.

The common electrode 270 may be formed on the organic emission layer 300 and the pixel definition layer 330. The common electrode 270 may be formed of a double layer including an upper layer and a lower layer, and may have transreflective characteristics by which it reflects a portion of light thereon and transmits the other portion of the light therethrough.

The pixel electrode 190, the organic emission layer 300, and the common electrode 270 may configure a light emitting device (LD) for displaying an image in the organic light emitting diode display device. The pixel electrode 190 may become an anode of the light emitting device, and the common electrode 270 may become a cathode of the light emitting device.

A capping layer 410 may be formed on the common electrode 270, and an encapsulation layer 420 may be formed on the capping layer 410. The capping layer 410 may be formed over an entire surface of the common electrode 270 to help protect the common electrode 270.

The light shielding member 500 may be formed on one surface of the encapsulation layer 420. The light shielding member 500 may be formed in a non-pixel area corresponding to the pixel definition layer 330 without being overlapped with the openings corresponding to the pixel.

The light shielding member 500 may be electrically connected to a ground electrode 124c of a pad part through a ground connection wiring 127, and the light shielding member 500 may effectively shield an electromagnetic wave and static electricity generated by the organic light emitting diode display device.

Next, a second exemplary embodiment will be described with reference to FIG. 3.

Figure 3:
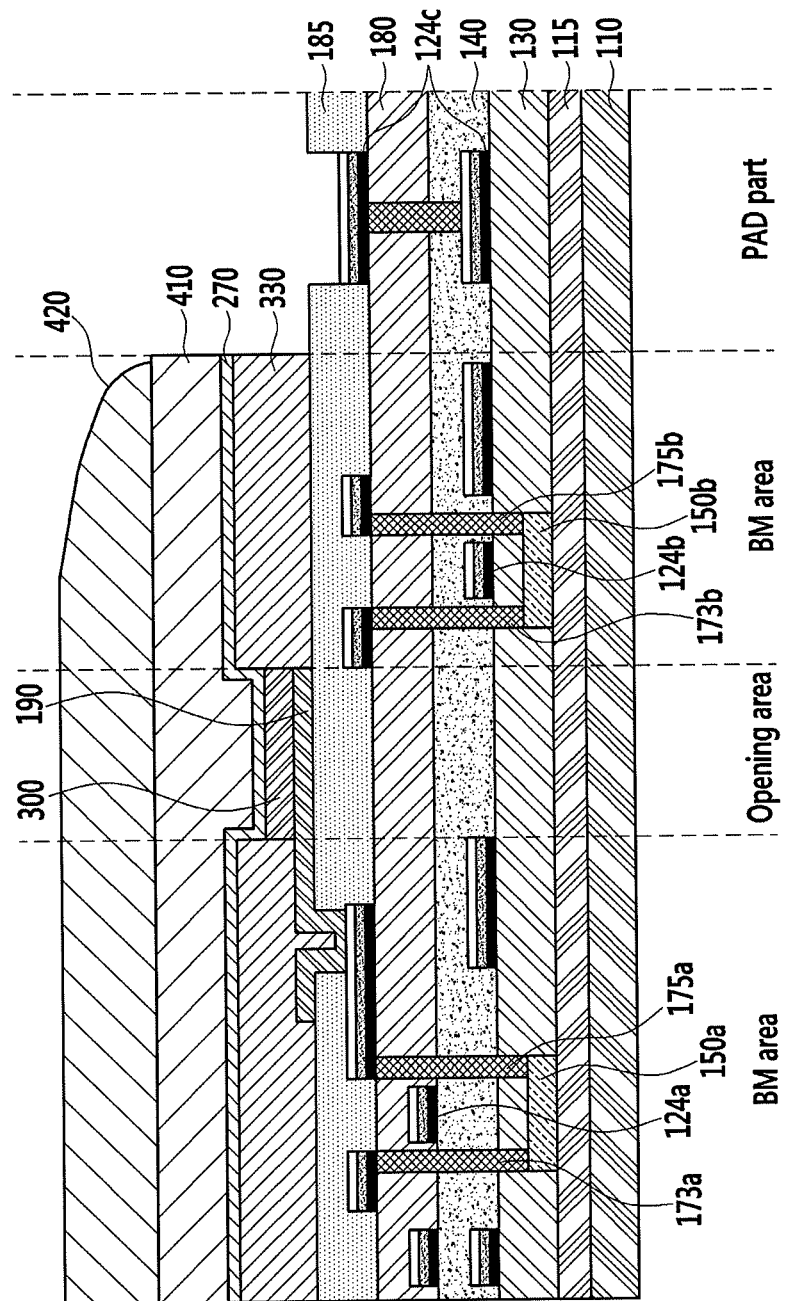
FIG. 3, which illustrates a cross-sectional view taken along line A-A of FIG. 1, illustrates a diagram of a second exemplary embodiment.

FIG. 3, which illustrates a cross-sectional view taken along line A-A of FIG. 1, illustrates a diagram of a second exemplary embodiment.

An organic light emitting diode display device according to a second exemplary embodiment is different from the organic light emitting diode display device according to a first exemplary embodiment only in that a shielding member 510 having a rear surface light emitting structure may be used instead of the light shielding member 500 having a front surface light emitting structure, and may have a structure of a pixel that is the same as that of the pixel of the organic light emitting diode display device according to a first exemplary embodiment. The same components will be denoted by the same reference numerals, and an overlapped description for the same components will be omitted.

In the organic light emitting diode display device according to a second exemplary embodiment, gate electrode 124a, 124b, and 124c, source electrode 173a and 173b, and drain electrode 175a and 175b may be formed of shielding electrodes having low reflection characteristics.

The shielding electrode may include, for example, a copper (Cu) layer, an indium zinc oxide (IZO) layer, and a titanium (Ti) layer that are sequentially formed. The shielding electrode may be formed of a mixture of two or more of copper (Cu), copper nitride ($CuN_x$), titanium (Ti), titanium nitride (TiN$_x$), titanium oxide (TiO$_x$), molybdenum nitride (MoN$_x$), indium zinc oxide (IZO), and indium tin oxide (ITO).

The shielding electrode may be electrically connected to the ground electrode of the pad part positioned outside the encapsulation layer, and the light electrode may effectively shield an electromagnetic wave and static electricity generated by the organic light emitting diode display device, similar to the light shielding member 500.

Next, a third exemplary embodiment will be described with reference to FIG. 4.

Figure 4:
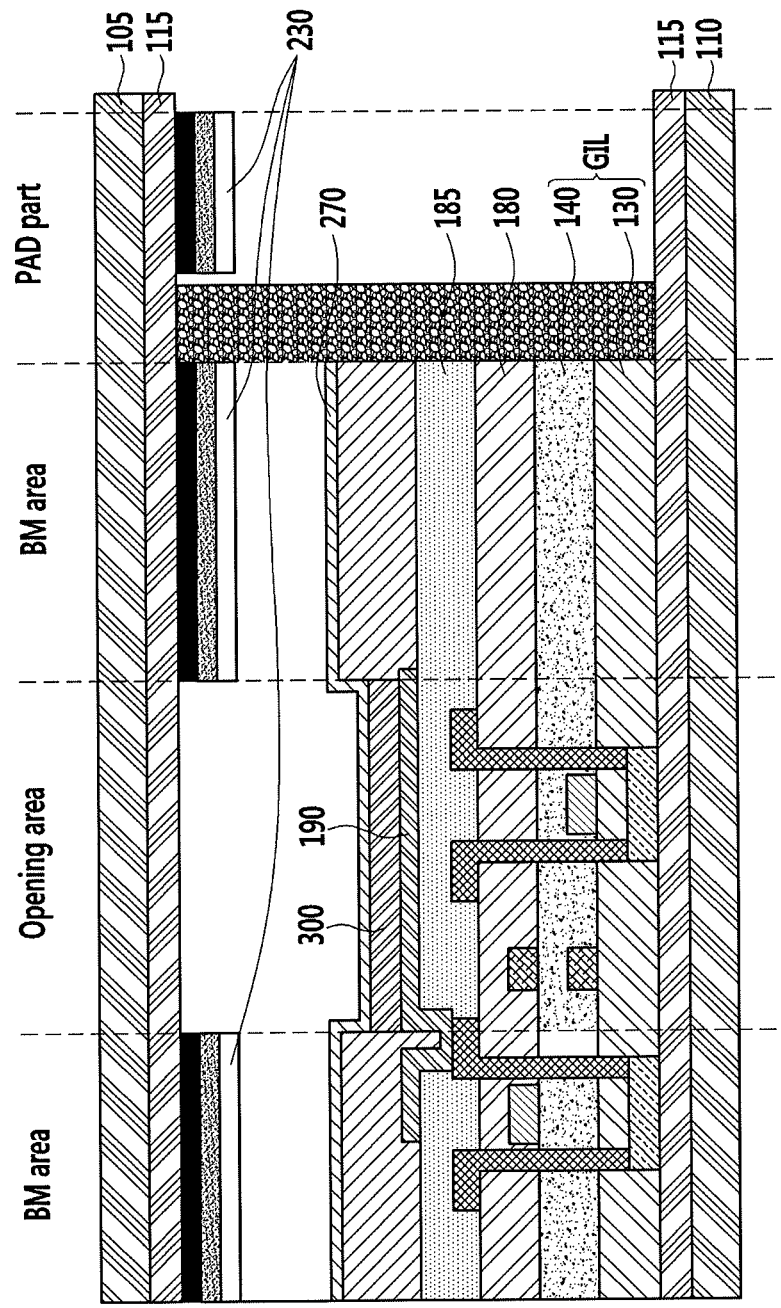
FIG. 4, which illustrates a cross-sectional view taken along line A-A of FIG. 1, illustrates a diagram of a third exemplary embodiment.

FIG. 4, which illustrates a cross-sectional view taken along line A-A of FIG. 1, illustrates a diagram of a third exemplary embodiment.

An organic light emitting diode display device according to a third exemplary embodiment is different from the organic light emitting diode display device according to a second exemplary embodiment only in that it may include an upper substrate and a lower substrate formed of a rigid material such as glass, and may have a structure of a pixel that is the same as that of the pixel of the organic light emitting diode display device according to a second exemplary embodiment. The same components will be denoted by the same reference numerals, and an overlapped description for the same components will be omitted.

As shown in FIG. 4, an organic light emitting diode display device according to a third exemplary embodiment may include an upper substrate 105 and a lower substrate 110 facing each other.

The upper substrate 105 and the lower substrate 110 are transparent insulation substrates formed of, for example, glass or plastic.

Buffer layers 115 may be formed at an inner side of the upper substrate 105 and on the lower substrate 110, respectively. The buffer layer 115 may contain, for exmaple, silicon nitride (SiN$_x$), silicon oxide (SiO$_x$), or silicon oxynitride (SiO$_x$N$_y$), and may be formed as a single layer or a multilayer. The buffer layer 115 may help prevent permeation of impurities, moisture, or external air degrading characteristics of a semiconductor and planarize a surface. According to an exemplary embodiment, the buffer layer 115 may also be positioned in the upper substrate 105 or the lower substrate 110. For example, the upper substrate 105 and the lower substrate 110 may have a structure in which polymer films (plastic layers) and the buffer layers are alternately stacked as a multilayer.

A semiconductor layer 150, a gate insulating layer (GIL), an interlayer insulating layer 180, a passivation layer 185, and a pixel electrode 190 may be formed on the lower substrate 110, as in first and second exemplary embodiments.

A pixel definition layer 330 may be formed in the vicinity of the pixel electrode 190, and may include a plurality of openings corresponding to one pixel. The pixel electrode 190 may be exposed in portions in which the pixel definition layer 330 is not formed, and the organic emission layer 300 may be positioned on the pixel electrode 190.

A low reflection opaque metal layer 230 may be formed in a non-pixel area that is not overlapped with the organic emission layer 300 at the inner side of the upper substrate 105. The low reflection opaque metal layer 230 may be formed in an area corresponding to an area in which the pixel definition layer 330 of the lower substrate 110 may be positioned. This may cover the opening of the pixel definition layer 330 since the opening may be an area in which the organic emission layer may emit light.

The low reflection opaque metal layer 230 may include, for example, a copper (Cu) layer, an indium zinc oxide (IZO) layer, and a titanium (Ti) layer that are sequentially formed. The low reflection opaque metal layer 230 may be formed of a mixture of two or more selected of copper (Cu), copper nitride (CuN$_x$), titanium (Ti), titanium nitride (TiN$_x$), titanium oxide (TiO$_x$), molybdenum nitride (MoN$_x$), indium zinc oxide (IZO), and indium tin oxide (ITO).

The low reflection opaque metal layer 230 may be electrically connected to the ground electrode of the pad part positioned outside the encapsulation layer, and the low reflection opaque metal layer 230 may effectively shield an electromagnetic wave and static electricity generated by the organic light emitting diode display device.

By way of summation and review, an organic light emitting diode display having self-light emitting characteristics may include two electrodes facing each other and an organic layer interposed between the two electrodes. In the organic light emitting diode display, holes injected from an anode and electrons injected from a cathode may meet each other in an emission layer to generate excitons, the excitons may emit light and may be extinguished, and light may be generated.

An organic light emitting diode display may not require a light source unlike the liquid crystal display, and a thickness and a weight of the display panel may be decreased. An organic light emitting diode display may have desirable characteristics such as, for example, low power consumption, high luminance, and a high reaction speed. An organic light emitting diode display may also be manufactured to be bendable using a plastic substrate.

In a display device, an electromagnetic wave harmful to the human body may be generated. To help shield the electromagnetic wave, a black matrix having improved conductivity may be used. A rigid substrate such as glass may be used, which may not be applied to a flexible display. Chrome (Cr) and chrome oxide may be used, and conductivity of a conducting wire may be decreased, which may be unfavorable in shielding an electromagnetic wave.

Provided is an organic light emitting diode display device that may improve shielding performance of an electromagnetic wave by increasing conductivity using a conductive black matrix or a low-refractive metal.

As set forth above, according to exemplary embodiments, shielding performance of an electromagnetic wave may be improved even in a flexible display, and the flexible device may be utilized for a wearable device closely adhered to the human body.

A metal material having low reflection characteristics may be used in wirings of the gate electrode, the source electrode, and the drain electrode, and an electromagnetic wave shielding effect may be maximized.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
a substrate;
a plurality of unit pixels disposed on the substrate, each of the plurality of unit pixels including a first pixel, a second pixel adjacent to the first pixel in a first direction, and a third pixel adjacent to the first pixel in a second direction crossing the first direction;
an encapsulation layer disposed on the plurality of unit pixels; and
a light shielding member disposed on the encapsulation layer, wherein
the light shielding member is disposed between the third pixel and at least one of the first pixel and the second pixel, in a plan view, and
the light shielding member is not disposed between the first pixel and the second pixel in each unit pixel.

2. The display device of claim 1, further comprising:
a pixel definition layer disposed between the plurality of unit pixels, wherein
the light shielding member overlaps the pixel definition layer.

3. The display device of claim 1, wherein the plurality of unit pixels are disposed in a matrix form.

4. The display device of claim 1, wherein the light shielding member includes a carbon black and a polymer organic material.

5. The display device of claim 4, wherein a content of the carbon black in the light shielding member is about 30 weight % or less.

6. The display device of claim 1, wherein the light shielding member is formed by an inkjet printing method.

7. The display device of claim 1, wherein
the encapsulation layer has a planar surface extending in the first direction perpendicular to a thickness direction;
the light shielding member directly contacting the planar surface of the encapsulation layer.

8. The display device of claim 7, wherein the planar surface extends in the first direction from a first surface of the light shielding member to a second surface of the light shielding member that is spaced apart from the first surface by an opening area.

9. The display device of claim 1, wherein
the light shielding member is formed of a lattice stripe pattern;
the lattice stripe pattern comprises a first light shielding member stripe having a fixed width in the second direction and extending in the first direction, and a second light shielding member stripe having a fixed width in the first direction extending in the second direction and overlapping the first light shielding member stripe.

10. A display device, comprising:
a substrate;
a plurality of unit pixels disposed on the substrate, each of the plurality of unit pixels including a first pixel, a second pixel adjacent to the first pixel in a first direction, and a third pixel adjacent to the first pixel in a second direction crossing the first direction;
an encapsulation layer disposed on the plurality of unit pixels; and
a light shielding member disposed on the encapsulation layer, wherein
the light shielding member is disposed between the third pixel and at least one of the first pixel and the second pixel, in a plan view, and
the light shielding member is electrically connected to a ground electrode of a pad part outside the encapsulation layer.

* * * * *